United States Patent

Moroz

(10) Patent No.: US 7,109,122 B2
(45) Date of Patent: Sep. 19, 2006

(54) METHOD AND APPARATUS FOR REDUCING SUBSTRATE CHARGING DAMAGE

(75) Inventor: Paul Moroz, Marblehead, MA (US)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 10/717,587

(22) Filed: Nov. 21, 2003

(65) Prior Publication Data

US 2004/0104358 A1 Jun. 3, 2004

Related U.S. Application Data

(60) Provisional application No. 60/429,557, filed on Nov. 29, 2002.

(51) Int. Cl.
 *H01L 21/461* (2006.01)
 *H01L 21/302* (2006.01)
(52) U.S. Cl. .................. 438/706; 438/710; 438/714
(58) Field of Classification Search ................ None
See application file for complete search history.

(56) References Cited

U.S. PATENT DOCUMENTS

| | | | | |
|---|---|---|---|---|
| 5,866,483 A | * | 2/1999 | Shiau et al. | 438/720 |
| 5,874,361 A | * | 2/1999 | Collins et al. | 438/716 |
| 5,928,528 A | | 7/1999 | Kubota et al. | |
| 5,983,828 A | | 11/1999 | Savas | |
| 6,008,139 A | * | 12/1999 | Pan et al. | 438/730 |
| 6,085,688 A | | 7/2000 | Lymberopoulos et al. | |
| 6,471,821 B1 | * | 10/2002 | Ogino et al. | 156/345.44 |
| 6,544,895 B1 | * | 4/2003 | Donohoe | 438/706 |
| 2001/0023743 A1 | | 9/2001 | Savas | |

FOREIGN PATENT DOCUMENTS

| | | |
|---|---|---|
| EP | 0 710 977 A1 | 5/1996 |
| JP | 10284297 | 10/1998 |
| WO | WO 2004/051710 | 6/2004 |

\* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

The present invention presents a method and apparatus for reducing charging damage to a substrate is described. In particular, a method of operating a plasma processing system is described that leads to the removal of, or significant reduction of, the accumulated charge on the substrate.

70 Claims, 8 Drawing Sheets

METHOD AND APPARATUS FOR REDUCING SUBSTRATE CHARGING DAMAGE

FIELD OF THE INVENTION

The present invention relates to a method and apparatus for plasma processing a substrate, and more particularly to a method and apparatus for reducing charging damage to the substrate during plasma processing.

BACKGROUND OF THE INVENTION

The fabrication of integrated circuits (IC) in the semiconductor device manufacturing industry typically employs plasma to create and assist surface chemistry necessary to remove material from and deposit material to a substrate. In general, plasma is formed within a plasma processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the processing system (e.g., etching processes where materials are removed from the substrate or deposition processes where materials are added to the substrate).

Subsequent to the use of plasma for IC fabrication, plasma charging damage has posed a very serious threat to the yield of acceptable devices when exposed to a processing plasma. As described above with regards to plasma processing, highly energetic particles, such as different ions, electrons, and photons, bombard the surface of the substrate and, depending on the nature of the material structures formed on the substrate, this energetic interaction with the substrate surface can lead to non-homogeneous charge accumulation and other forms of structural damage, either of which can be catastrophic to the ICs formed thereon. For example, substrate charging damage can manifest as physical damage to crystalline silicon by energetic ions, or electrical damage to $SiO_2$.

Moreover, as described above, substrate charging damage can arise from non-homogeneous charge accumulation due to, for example, electron shading. Electron shading generally occurs when etching high aspect ratio contacts/vias or trenches in dielectric materials and, more recently, electron shading damage has been further exacerbated due to the continual reduction in feature size, and consequent increase in feature aspect ratio. During electron shading, electrons, being mostly isotropic in directionality, tend to have difficulty reaching the bottoms of high aspect ratio features and, therefore, they tend to accumulate at the tops of high aspect ratio features. Conversely, ions are mostly directional and tend to reach the bottoms of these features, hence, leading to electric fields induced by charge separation.

Furthermore, a non-homogeneous charge accumulation can arise from the development of a non-homogeneous plasma in electrical contact with the substrate surface. Consequently, static electric fields can develop laterally across the substrate surface, and they can become of sufficient strength to cause electrical breakdown.

In either case, the formation of static electric fields on the substrate can be sufficient to cause electrical breakdown (or arcing) in more extreme cases, and reduced IC lifetime in less extreme cases, each of which is capable of reducing IC yield.

SUMMARY OF THE INVENTION

The present invention provides a method for processing a substrate, wherein the processing method advantageously addresses the above-identified shortcomings.

It is an object of the present invention to provide a method of reducing charging damage to a substrate in a plasma processing system comprising the steps: exposing the substrate to a plasma; coupling a first power to the plasma processing system to process the substrate; and coupling a second power to the plasma processing system, wherein the second power is selected to reduce an accumulation of negative charge on one or more surfaces exposed to the plasma in the plasma processing system.

It is another object of the present invention to provide a method of reducing negative charge on exposed surfaces within a plasma processing system comprising the steps: introducing an ionizable gas; and forming a plasma by coupling an intermediate power to the ionizable gas, wherein the intermediate power facilitates a secondary electron yield from said exposed surfaces greater than unity.

It is another object of the present invention to provide a method for reducing charging damage in a plasma processing system comprising the steps: introducing an ionizable gas; forming a plasma from the ionizable gas; exposing a substrate to the plasma; and processing the substrate by coupling an intermediate power to the plasma processing system, wherein the intermediate power reduces an accumulation of negative charge on one or more surfaces exposed to the plasma in said plasma processing system.

It is another object of the present invention to provide a method of reducing charging damage to a substrate in a plasma processing system comprising the steps: identifying one or more exposed surfaces in the plasma processing system; disposing a secondary electron emitter on at least one of the one or more exposed surfaces, wherein the secondary electron emitter comprises a material having a secondary electron yield greater than unity; selecting an intermediate power, wherein the intermediate power corresponds to the secondary electron yield greater than unity for the secondary electron emitter; introducing an ionizable gas to the plasma processing system; forming a plasma from the ionizable gas; exposing the substrate to the plasma; and coupling the intermediate power to the plasma processing system to process the substrate.

It is another object of the present invention to provide a plasma processing system for reducing charging damage to a substrate, wherein the plasma processing system comprises: a plasma processing chamber to contain a plasma, the plasma processing chamber comprising one or more exposed surfaces in electrical contact with the plasma; one or more electrodes coupled to the plasma processing chamber and configured to facilitate formation of the plasma; and at least one secondary electron emitter coupled to at least one of the one or more exposed surfaces, wherein the secondary electron emitter comprises a material having a secondary electron yield greater than unity.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides a method and apparatus for reducing charging damage to the substrate during plasma processing.

Figure 1:
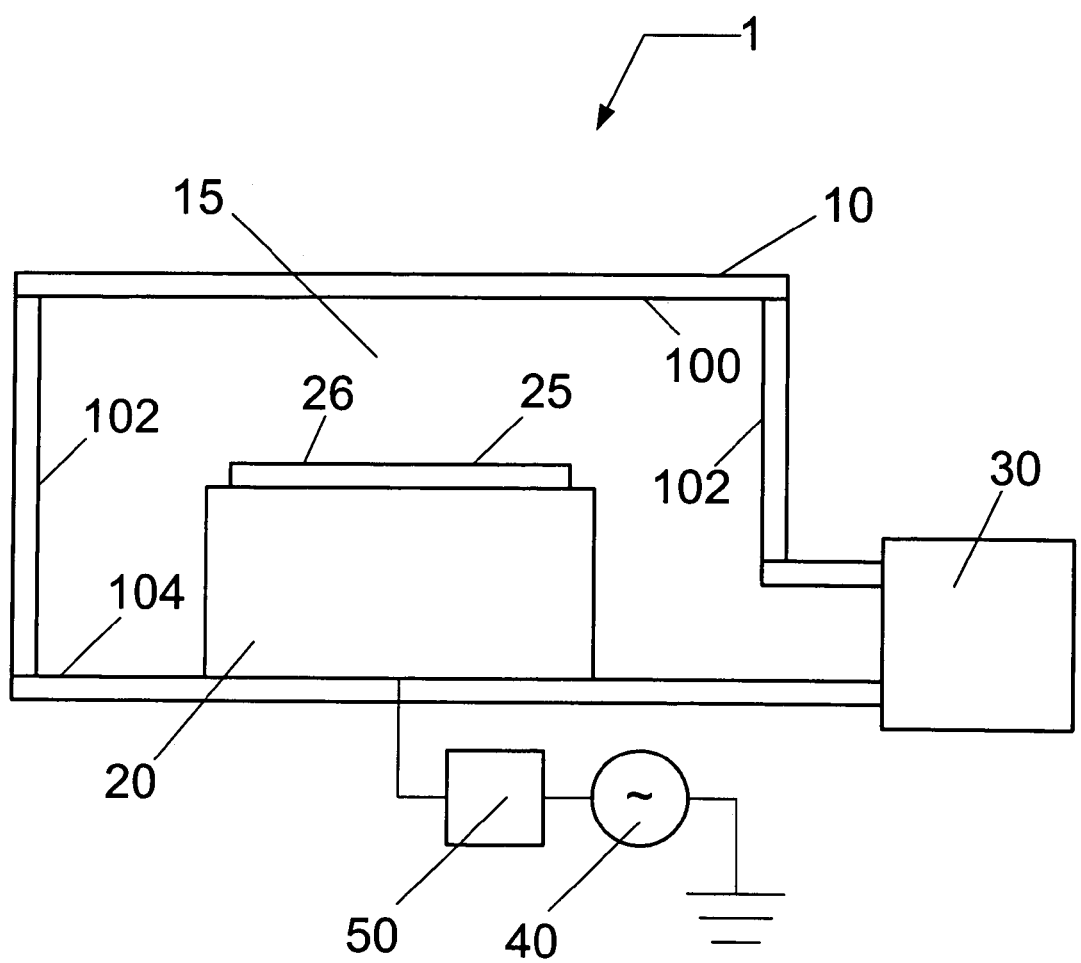
FIG. 1 shows a simplified block diagram of a plasma processing system according to an embodiment of the present invention.

According to an embodiment of the present invention, a plasma processing system 1 is depicted in FIG. 1 comprising a plasma processing chamber 10, a substrate holder 20 for supporting a substrate 25, and a pumping system 30 for providing a reduced pressure atmosphere in plasma processing chamber 10. Plasma processing chamber 10 can facilitate the formation of a processing plasma in a process space 15 adjacent substrate 25. The plasma processing system 1 can be configured to process substrates (e.g., 200 mm substrates, 300 mm substrates, or larger).

Substrate 25 can be, for example, transferred into and out of plasma processing chamber 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

Substrate 25 can be, for example, affixed to the substrate holder 20 via an electrostatic clamping system. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, gas can, for example, be delivered to the backside of substrate 25 via a backside gas system to improve the gas-gap thermal conductance between substrate 25 and substrate holder 20. Such a system can be utilized when temperature control of the substrate is required at elevated or reduced temperatures. In other embodiments, heating elements, such as resistive heating elements, or thermo-electric heaters/coolers can be included.

Plasma processing system 1 can, for example, further comprise a vertical translational device (not shown) surrounded by a bellows (not shown) coupled to the substrate holder 20 and the plasma processing chamber 10, and configured to seal the vertical translational device from the reduced pressure atmosphere in plasma processing chamber 10. Additionally, a bellows shield (not shown) can, for example, be coupled to the substrate holder 20 and configured to protect the bellows from the processing plasma. Substrate holder 20 can, for example, further comprise at least one of a focus ring (not shown), a shield ring (not shown), and a baffle plate (not shown).

In the illustrated embodiment, shown in FIG. 1, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Figure 2:
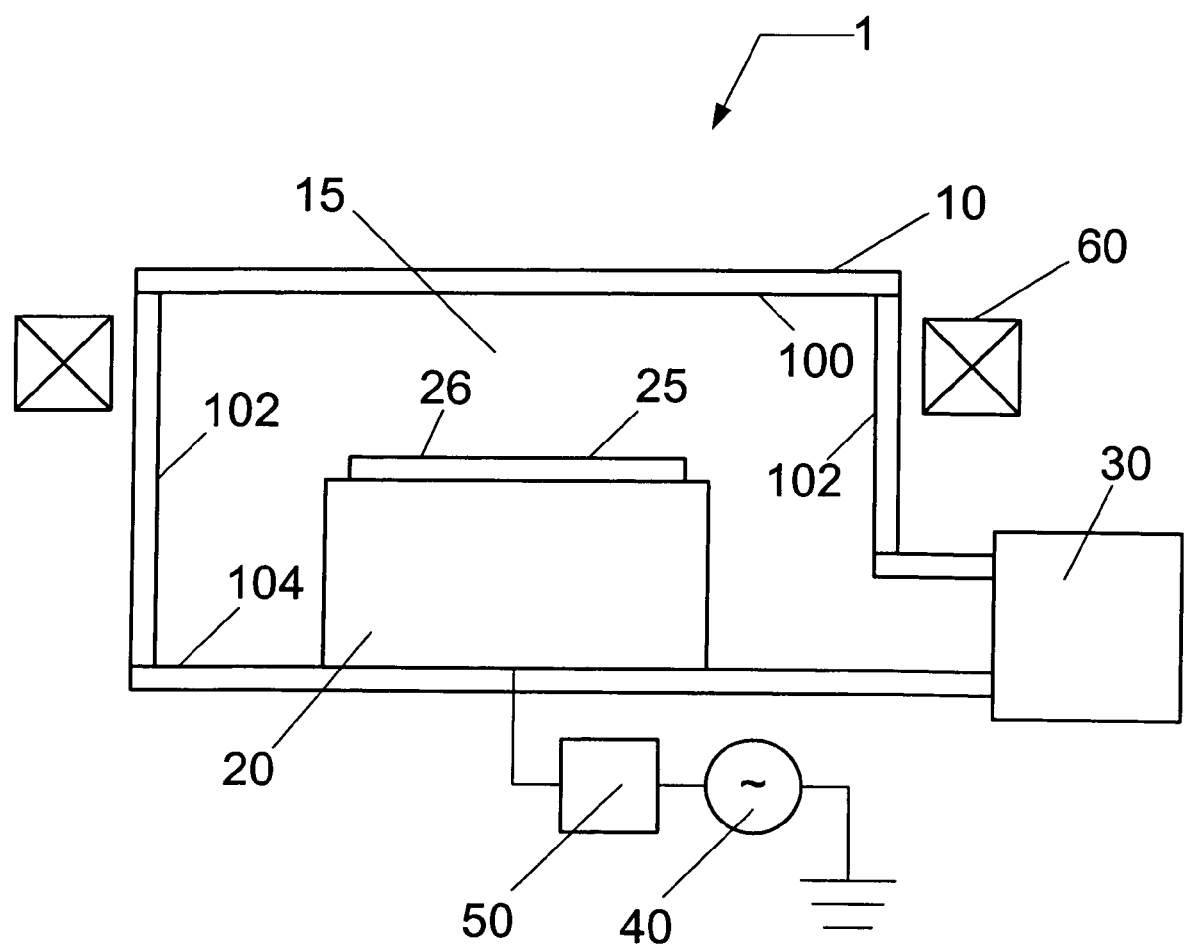
FIG. 2 shows a simplified block diagram of a plasma processing system according to another embodiment of the present invention.

Alternately, the processing plasma formed in process space 15 can be formed using a parallel-plate, capacitively coupled plasma (CCP) source, an inductively coupled plasma (ICP) source, any combination thereof, and with and without DC magnet systems. For example, FIG. 2 presents an exemplary plasma processing system as illustrated in FIG. 1 further including a magnet system 60. The magnet system can be stationary or non-stationary (i.e. rotating). Alternately, the processing plasma in process space 15 can be formed using electron cyclotron resonance (ECR). In yet another embodiment, the processing plasma in process space 15 is formed from the launching of a Helicon wave. In yet another embodiment, the processing plasma in process space 15 is formed from a propagating surface wave.

Referring again to the illustrated embodiment of the present invention depicted in FIG. 1, the plasma processing chamber 10 comprises several surfaces exposed to, or in electrical contact with, the processing plasma in process space 15 including, for example, an upper surface 100, a side-wall surface 102, a bottom surface 104, and an upper surface 26 of substrate 25. In general, one or more of these exposed surfaces comprises a dielectric material, an electrically floating surface, or a surface with some capacitance or significant resistance to ground or other potential. As a result, these surfaces typically charge negative due to greater electron mobility within the processing plasma. Moreover, these surfaces can be susceptible to uneven charging associated with variations in secondary electron emission, and the electrical interaction between these surfaces and the processing plasma.

Spatially non-homogeneous charging of surfaces can directly lead to substrate charging damage particularly when it is the substrate that has sustained uneven charging, and it can indirectly lead to substrate charging damage due to the interaction of exposed surfaces with the processing plasma which can affect the plasma state as well as influence the break-down properties of the processing plasma during ignition. For example, referring to FIG. 3, a conventional method of operating the plasma processing systems depicted in FIGS. 1 and 2 is described. During substrate processing, an ionizable gas is introduced to the plasma processing chamber 10, and a processing pressure is established according to a pre-determined process recipe. The processing plasma is formed within process space 15 following the application of RF power to substrate holder 20 using RF generator 40.

Figure 3:
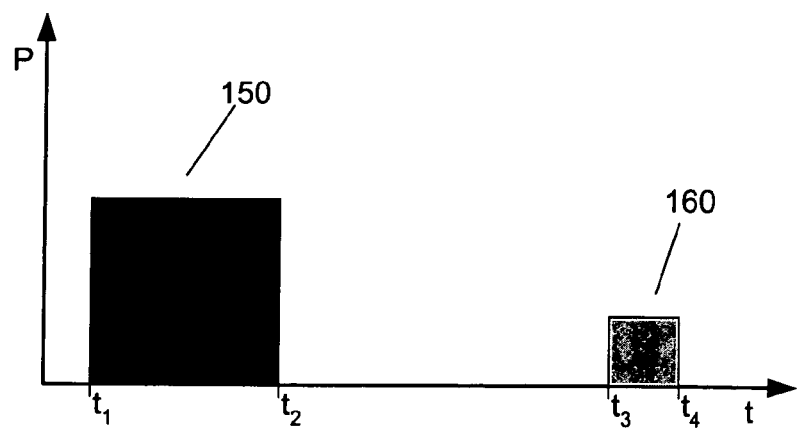
FIG. 3 shows a conventional method of operating the plasma processing system of FIG. 1.

As shown in FIG. 3, RF power is provided as a function of time, from time t1 until t2. As illustrated, the power is applied as a "square" waveform 150. That is, the RF power applied to substrate holder 20 is constant for a period of time sufficient to complete the plasma process, and the application of RF power is terminated. Those skilled in the art will recognize that a "square" waveform is not required for the invention, and that power can be applied or removed, at times t1 and t2, respectively, in a linear or non-linear fashion. The plasma process can, for example, comprise an etch process, wherein a contact, via, or trench is formed within an underlying layer by transferring a pattern formed within a protective mask, such as photoresist, to the underlying layer.

During plasma processing, exposed surfaces of the plasma processing chamber 10 including the upper surface 26 of substrate 25 accumulate charge, and potentially unevenly accumulate charge. In some instances, the uneven charging of the substrate surface is sufficient to cause damage to the substrate. In alternate instances, damage has yet to occur; however, the probability of damage occurring in successive steps has increased. For example, the plasma processing step indicated in FIG. 3 by the first square wave 150 can be followed by a relatively lower power processing step indicated in FIG. 3 by the second square wave 160. Those skilled in the art will recognize that the "square" wave representations are used for illustrative purposes and not required for the invention, and that power can be applied or removed, at times t3 and t4 respectively, in a linear or non-linear fashion. The relatively low power processing step can further comprise an alternate mixture of processing gases and an alternate processing pressure according to the prescribed recipe. For example, the relatively low power processing step can comprise an ashing process to facilitate the removal of the protective mask, and other etch process residue remaining on the etched features.

However, it has been observed by the inventors that the application of RF power during the relatively low power processing step has encountered some difficulty in igniting the processing plasma, and this difficulty is accompanied by higher voltages, that can at times be variable, on the substrate holder 20. As a result of the higher, variable voltages present on the substrate holder 20, substrate charging damage has been purported to occur.

Figure 4:
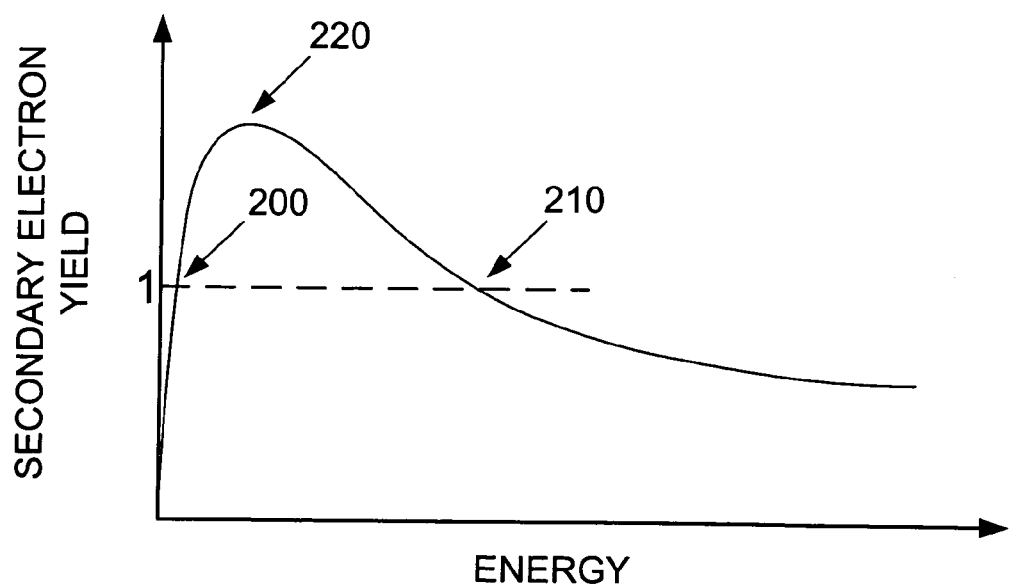
FIG. 4 illustrates an exemplary dependence of the secondary electron yield on the electron energy.

The extent of surface charging on exposed surfaces, as well as the extent of uneven charging on exposed surfaces, can be strongly influenced by the nature of the materials exposed to the processing plasma and their respective secondary electron emission properties. For example, FIG. 4 illustrates a typical secondary electron emission function, wherein the secondary electron yield is shown to depend on the energy of an incident electron striking the exposed surface. The secondary electron yield is the number of secondary electrons emitted from a material surface for every incident primary electron. In general, as shown in FIG. 4, the yield is a function of the primary electron energy; however, it can further be dependent on surface conditions of the exposed surface (i.e. clean or unclean), the surface roughness, surface condensation, etc. Another interesting feature, illustrated in FIG. 4, is there exists a range of primary electron energy wherein the secondary electron yield is greater than unity (i.e. more secondary electrons released per incident primary electrons). In FIG. 4, this range of energy is depicted as extending from a value of $E_{min}$ (denoted as 200 in FIG. 4) to $E_{max}$ (denoted as 210 in FIG. 4), wherein there exists an energy level associated with a peak (denoted as 220 in FIG. 4) in the secondary electron yield. For example, if the surface material is silicon, the maximum secondary electron yield $\delta=1.1$ occurs at an energy of $E_{peak}=250$ eV, and the minimum and maximum energies between which $\delta>1$ are $E_{min}=125$ eV and $E_{max}=500$ eV. In another example, if the surface material is alumina, the peak secondary electron yield is $\delta=2.9$.

As described above, depending on the material properties, a range of electron energy can exist wherein the secondary electron yield exceeds unity and, therefore, this observation can be exploited to reduce the negative charging of exposed surfaces as well as the substrate surface during plasma processing. For example, in order to illustrate a relationship between the secondary electron yield and the RF power, the inventors have empirically determined such a relationship for the plasma processing systems depicted in FIGS. 1 and 2. The relationship between the peak-to-peak voltage $V_{pp}$ measured on the substrate holder 20 to the RF power P applied to the substrate holder 20 was empirically determined to be $$V_{pp} \propto \sqrt{P} \approx 27.66\sqrt{P}. \qquad (1)$$

Since the voltage amplitude is one half the peak-to-peak voltage, the amplitude of the electric field $E_a$, for example, between the substrate holder 20 and the upper surface 100 of the plasma processing chamber 10 in FIG. 2 can be expressed as $$E_a \approx 13.83\sqrt{P}/d, \qquad (2)$$

where d is the distance between the substrate holder 20 and the upper surface 100 of the plasma processing chamber 10. Now, the maximum energy (in eV) an electron can achieve in the presence of the above described electric field is equivalent to the potential difference between the substrate holder 20 and the upper surface 100 of the plasma processing chamber 10. In this case, $$\epsilon = mv^2/2 = e\Phi, \qquad (3)$$

where m is the mass of an electron, e is the fundamental electric charge, v is the electron velocity, and $\Phi$ is the potential difference. In other words, the maximum energy $\epsilon$ is derived from the conversion of the potential energy of an electron to kinetic energy as it is accelerated across the process space (for a conservative system, i.e. no collisions). Given that, at an instant in time $\Phi$ is $E \cdot d$, the maximum energy $\epsilon$ can be related to the RF power by combining equations (2) and (3), and therefore, $$\epsilon \approx 13.83\sqrt{P}. \qquad (4)$$

For example, using a typical RF power of approximately 2000 W, the primary electron energy incident upon an exposed surface can be in excess of 618.5 eV. If the surface material is silicon, the secondary electron yield for high energy electrons is less than unity, as depicted in FIG. 4, and, therefore, the exposed surface is expected to accumulate negative charge.

In contrast, using an intermediate power such as 600 W, the primary electron energy incident upon an exposed surface can be in excess of 338.8 eV. Again, if the surface material is silicon, the secondary electron yield is expected to be greater than unity (energy near peak energy) and, therefore, the exposed surface is expected to be relieved of negative charge. Alternatively, very low powers or characteristically high powers can be utilized to increase negative charging of surfaces.

Figure 5:
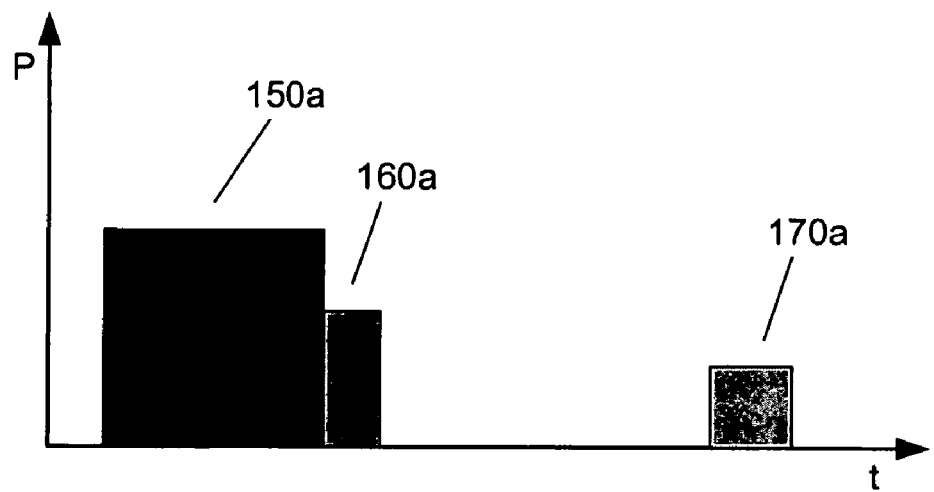
FIG. 5 illustrates a method of operating the plasma processing system of FIG. 1 according to an embodiment of the present invention.

In an embodiment of the present invention, charge accumulation on exposed surfaces of the plasma processing system 1 is reduced by applying RF power to the plasma processing system, such as the substrate holder 20 depicted in FIGS. 1 and 2, at an intermediate power level immediately following a high power application without extinguishing the plasma in the plasma processing chamber 10. FIG. 5 illustrates an exemplary power application sequence to achieve the above identified condition. Herein, a high power application 150$a$ is defined as the application of a high power level, typically above 1000 W, when an essential fraction of energetic electrons is produced with energies $\epsilon$ above $E_{max}$, so the effective secondary electron yield coefficient $\delta>1$, and an intermediate power level is defined as a power less than the high power level, when typically $E_{min}<\epsilon<E_{max}$ and $\delta<1$.

Figure 6:
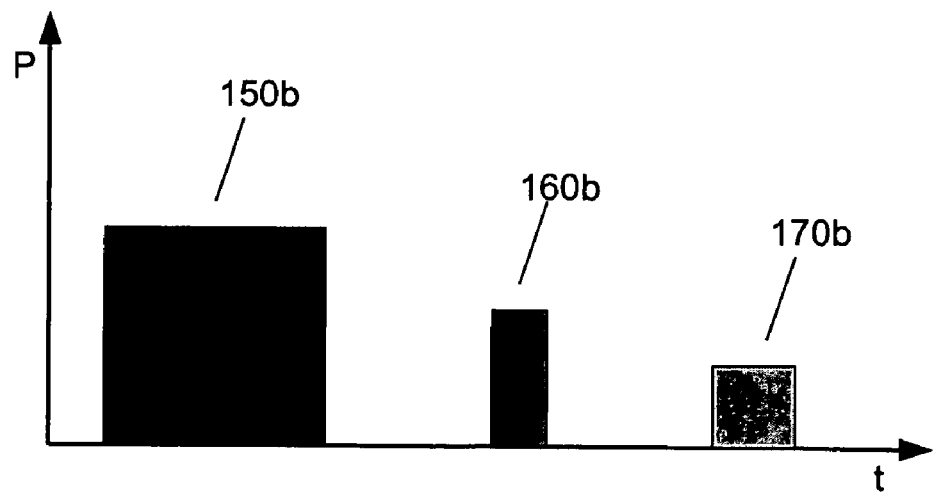
FIG. 6 illustrates a method of operating the plasma processing system of FIG. 1 according to another embodiment of the present invention.

In another embodiment of the present invention, charge accumulation on exposed surfaces of the plasma processing system 1 is reduced by applying RF power to the plasma processing system, such as the substrate holder 20 depicted in FIGS. 1 and 2, at an intermediate power level 160$b$ following a high power application 150$b$, wherein a period of time, sufficient to extinguish the plasma, elapses between the respective high power application 150$b$ and the intermediate power application 160$b$. FIG. 6 illustrates an exemplary power application sequence to achieve the above identified condition.

Figure 7:
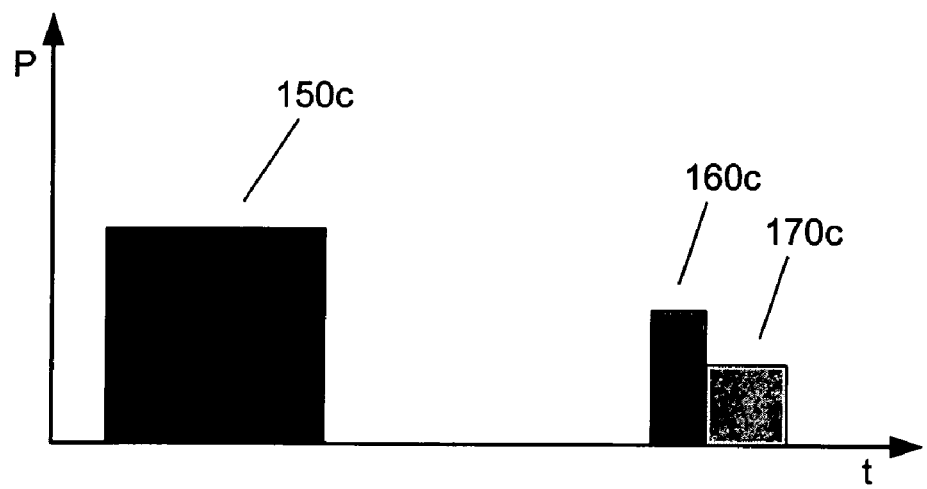
FIG. 7 illustrates a method of operating the plasma processing system of FIG. 1 according to another embodiment of the present invention.

In another embodiment of the present invention, charge accumulation on exposed surfaces of the plasma processing system 1 is reduced by applying RF power to the plasma processing system, such as the substrate holder 20 depicted in FIGS. 1 and 2, at an intermediate power level following a high power application, wherein a period of time, sufficient to extinguish the plasma, elapses between the respective high power application 150$c$ and intermediate power application 160$c$, and the intermediate power application 160$c$ immediately precedes a low power application 170$c$. FIG. 7 illustrates an exemplary power application sequence to achieve the above identified condition. Herein, a low power application is defined as the application of a low power level, typically, below a few hundred watts, when the secondary electron yield coefficient $\delta$ is below 1, and an intermediate power level is defined as that corresponding to $\delta>1$, and is a power greater than the low power level.

Figure 8:
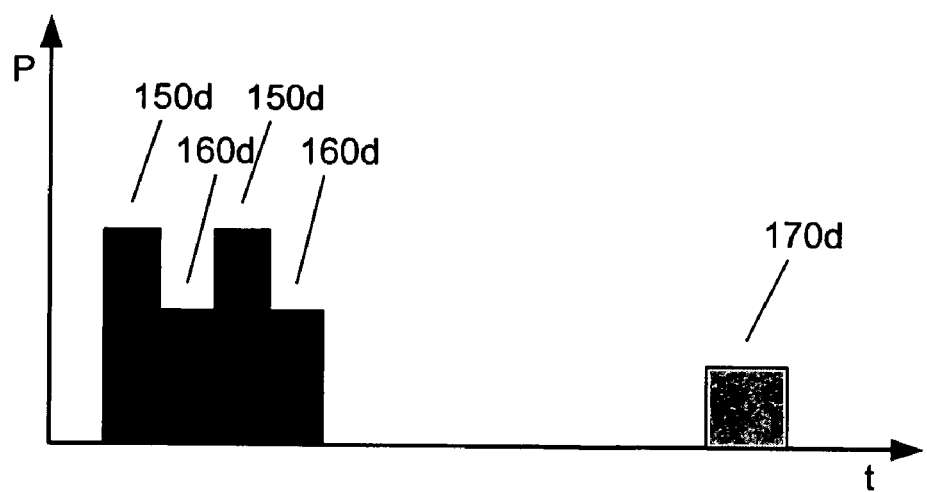
FIG. 8 illustrates a method of operating the plasma processing system of FIG. 1 according to another embodiment of the present invention.

In another embodiment of the present invention, charge accumulation on exposed surfaces of the plasma processing system 1 is reduced by applying RF power to the plasma processing system, such as the substrate holder 20 depicted in FIGS. 1 and 2, at both intermediate power level applications 160$d$ and high power applications 150$d$ without extinguishing the plasma in the plasma processing chamber 10. FIG. 8 illustrates an exemplary power application sequence to achieve the above identified condition, wherein one or more intermediate power steps are disposed within the high power applications 150$d$. Herein, a high power application is defined as the application of a high power level when effective $\delta<1$, which typically corresponds to power of 1000 W or more, and an intermediate power level is defined as that corresponding to effective $\delta>1$, and is a power less than the high power level.

Figure 9:
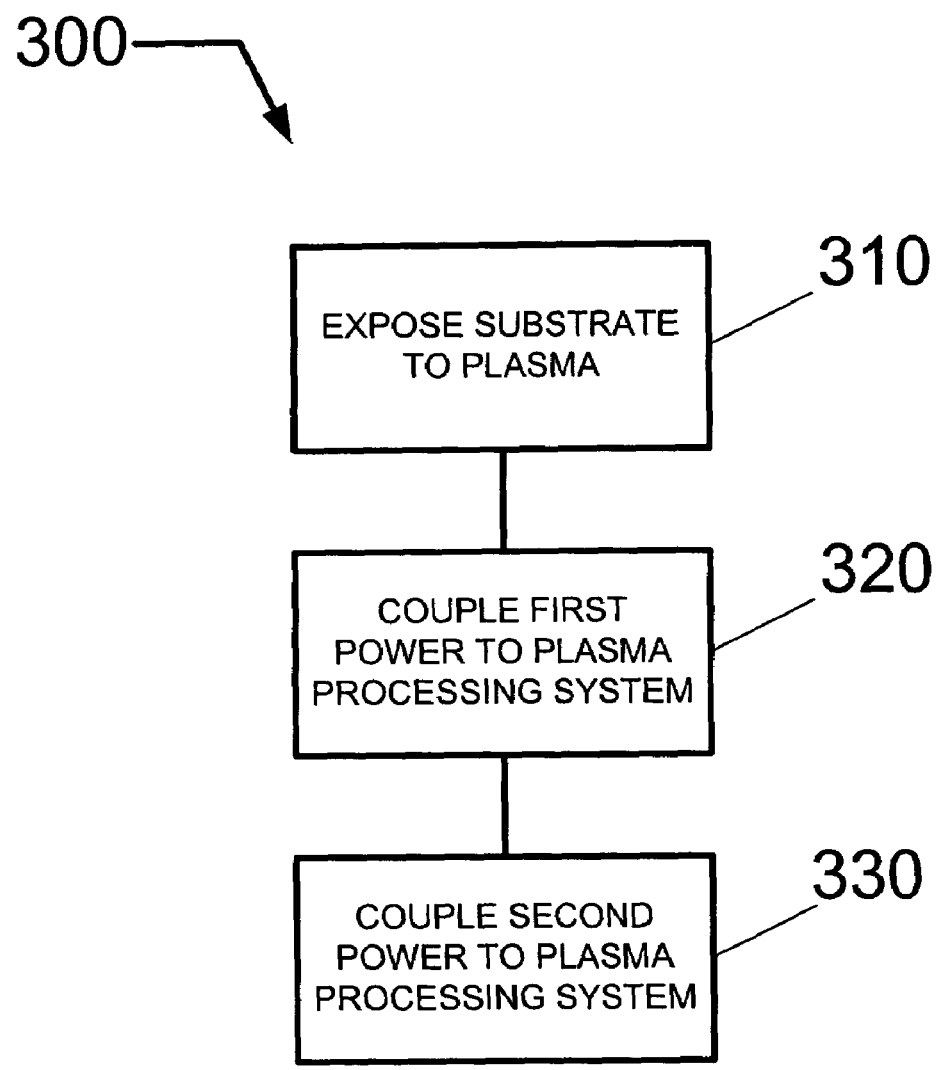
FIG. 9 presents a method of reducing charging damage to a substrate in a plasma processing system according to an embodiment of the present invention.

FIG. 9 presents a method for reducing charging damage to a substrate in a plasma processing system according to an embodiment of the present invention. The method is illustrated in a flowchart 300 beginning in step 310 with exposing the substrate to plasma to facilitate plasma processing of the substrate. Exposure of the substrate to plasma can comprise a number of steps well known to those skilled in the art of plasma processing, including, for example, loading the substrate into the plasma processing system and affixing the substrate to a substrate holder; introducing an ionizable gas; achieving a processing pressure; and forming a plasma from the ionizable gas.

In step 320, a first power is coupled to the plasma processing system to facilitate plasma processing of the substrate. The first power can, for example, be applied to an electrode within the plasma processing system, wherein the application of power can originate from a RF generator. An impedance match network can be utilized to maximize the transfer of power from the RF generator through the electrode to the plasma. The electrode can, for example, be the substrate holder upon which the substrate rests. Alternatively, the electrode can be opposite the substrate holder, such as positioned above the substrate.

In step 330, a second power is coupled to the plasma processing system to reduce negative charge accumulation on one or more exposed surfaces in the plasma processing system. The one or more exposed surfaces can comprise any surface in electrical contact with the plasma. For example, the exposed surfaces can comprise the upper surface of the substrate, the upper surface of the plasma processing system, the side-wall surface of the plasma processing system, and the lower surface of the plasma processing system. The second power 160$a$ can be coupled to the plasma processing system immediately following the coupling of the first power 150$a$ to the plasma processing system such that the plasma does not extinguish (see FIG. 5). Alternately, the second power 160$b$ can be coupled to the plasma processing system following the application of the first power 150$b$ to the plasma processing system such that the plasma does extinguish and the coupling of the second power to the plasma processing system forms a second plasma (see FIG. 6). Alternately, a third power 170$a$ can be coupled to the plasma processing system following the coupling of the second power to the plasma processing system. For example, the third power 170$c$ can be coupled to the plasma processing system immediately following the coupling of the second power 160$c$ to the plasma processing system such that the second plasma does not extinguish (see FIG. 7). Alternately, the third power 170$b$ can be coupled to the plasma processing system following the coupling of the second power 160$b$ to the plasma processing system such that the second plasma does extinguish and the coupling of the third power 170$b$ to the plasma processing system forms a third plasma (see FIG. 6). Alternately, the coupling of the first power 150$d$ to the plasma processing system alternates with the coupling of the second power 160$d$ to the plasma processing system during the processing of the substrate (see FIG. 8).

The second power comprises an intermediate power level corresponding to a secondary electron yield from at least one of the exposed surfaces greater than unity. For example, when the plasma processing comprises silicon processing, the intermediate power level can range from 50 W to 1500 W, and can, for example, be substantially 600 W. Alternatively, the intermediate power level can be selected from a range of power corresponding to a range of primary electron energy from a minimum value to a maximum value, wherein the range extending from the minimum to maximum values is associated with a secondary electron yield greater than unity for the material of at least one of the exposed surfaces. For example, the minimum and maximum electron energy for a primary electron incident on a silicon surface, such that the secondary electron yield is greater than unity, is approximately 125 eV and 500 eV, respectively, which correspond to an intermediate power level of approximately 80 W and 1310 W (using equation (4)). Other exemplary power ranges include: greater than approximately 80 W and less than approximately 1310 W, greater than approximately 115 W and less than approximately 1060 W, greater than approximately 205 W and less than approximately 840 W, greater than approximately 260 W and less than approximately 640 W, and greater than approximately 400 W and less than approximately 640 W.

Additionally, the intermediate power level can correspond to a primary electron energy substantially near the value associated with a peak secondary electron yield. For example, the peak secondary electron yield for silicon occurs at an energy of 250 eV, which corresponds to an intermediate power level of approximately 326 W (using equation (4)). Alternatively, the secondary electron yield greater than unity corresponds to a range of electron energy from $\epsilon_{min}$ to $\epsilon_{max}$, and said second power corresponds to $(\epsilon/C)^2$, wherein $\epsilon$ comprises an electron energy in said range and C comprises a constant. Such as embodiment may utilize a constant C between 10 and 20, and C is preferably about 14. Alternate electron energy ranges include 125 eV to 500 eV. Similarly, electron energies ranging from the peak electron energy minus 10% to the peak electron energy plus 50% and from the peak electron energy minus 20% to the peak electron energy plus 60% are similarly possible.

It has to be taken into consideration, that Eq. (4) provides an estimate for the maximum electron energy, thus the power levels required for the current invention to work are somewhat higher than that estimated from Eq. 4. Also, the particular correspondence given by Eq. 4 is provided here only as an example valid for a particular chamber and for particular experiments that we did. A different relation will hold for a different chamber or different materials or conditions, but the logic, method, and apparatus of the current invention for reducing substrate charging still applicable. In general, the intermediate power level can correspond to a power slightly greater than the power determined to be associated with the peak secondary electron yield of a material in order to maximize the probability of observing primary electrons with an energy associated with the peak secondary electron yield (i.e. selecting an appropriate electron energy distribution function.

Figure 10:
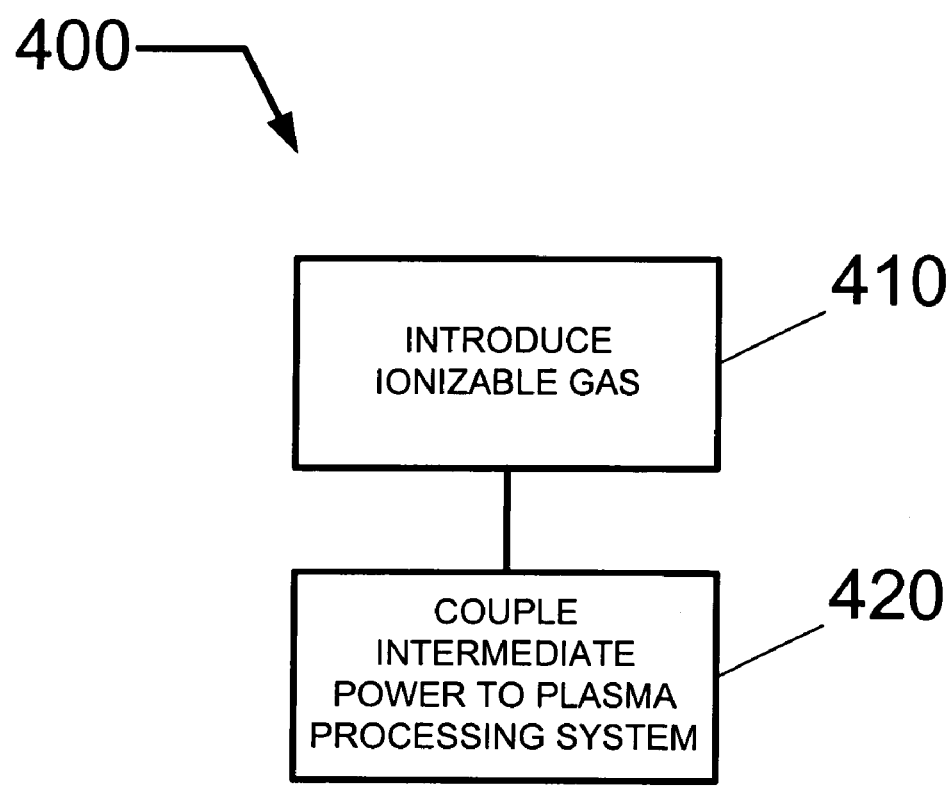
FIG. 10 presents a method of reducing charging damage to a substrate in a plasma processing system according to another embodiment of the present invention.

FIG. 10 presents a method for reducing negative charge accumulation on exposed surfaces in a plasma processing system according to another embodiment of the present invention. The method is illustrated in a flowchart 400 beginning in 410 with introducing an ionizable gas. In 420, an intermediate power is coupled to the plasma processing system.

The intermediate power corresponds to a secondary electron yield from at least one of the exposed surfaces greater than unity. For example, when the exposed surface comprises silicon, the intermediate power level can range from 50 W to 1500 W, and can, for example, be substantially 600 W. Alternatively, the intermediate power level can be selected from a range of power corresponding to a range of primary electron energy from a minimum value to a maximum value, wherein the range extending from the minimum to maximum values is associated with a secondary electron yield greater than unity for the material of at least one of the exposed surfaces. For example, the minimum and maximum electron energy for a primary electron incident on a silicon surface, such that the secondary electron yield is greater than unity, is approximately 125 eV and 500 eV, respectively, which correspond to an intermediate power level of approximately 80 W and 1310 W (using equation (4)). Additionally, the intermediate power level can correspond to a primary electron energy substantially near the value associated with a peak secondary electron yield. For example, the peak secondary electron yield for silicon occurs at an energy of 250 eV, which corresponds to an intermediate power level of approximately 326 W (using equation (4)). In general, the intermediate power level can correspond to a power somewhat greater than the power determined to be associated with the peak secondary electron yield of a material in order to maximize the probability of observing primary electrons with an energy associated with the peak secondary electron yield (i.e. selecting an appropriate electron energy distribution function.

Figure 11:
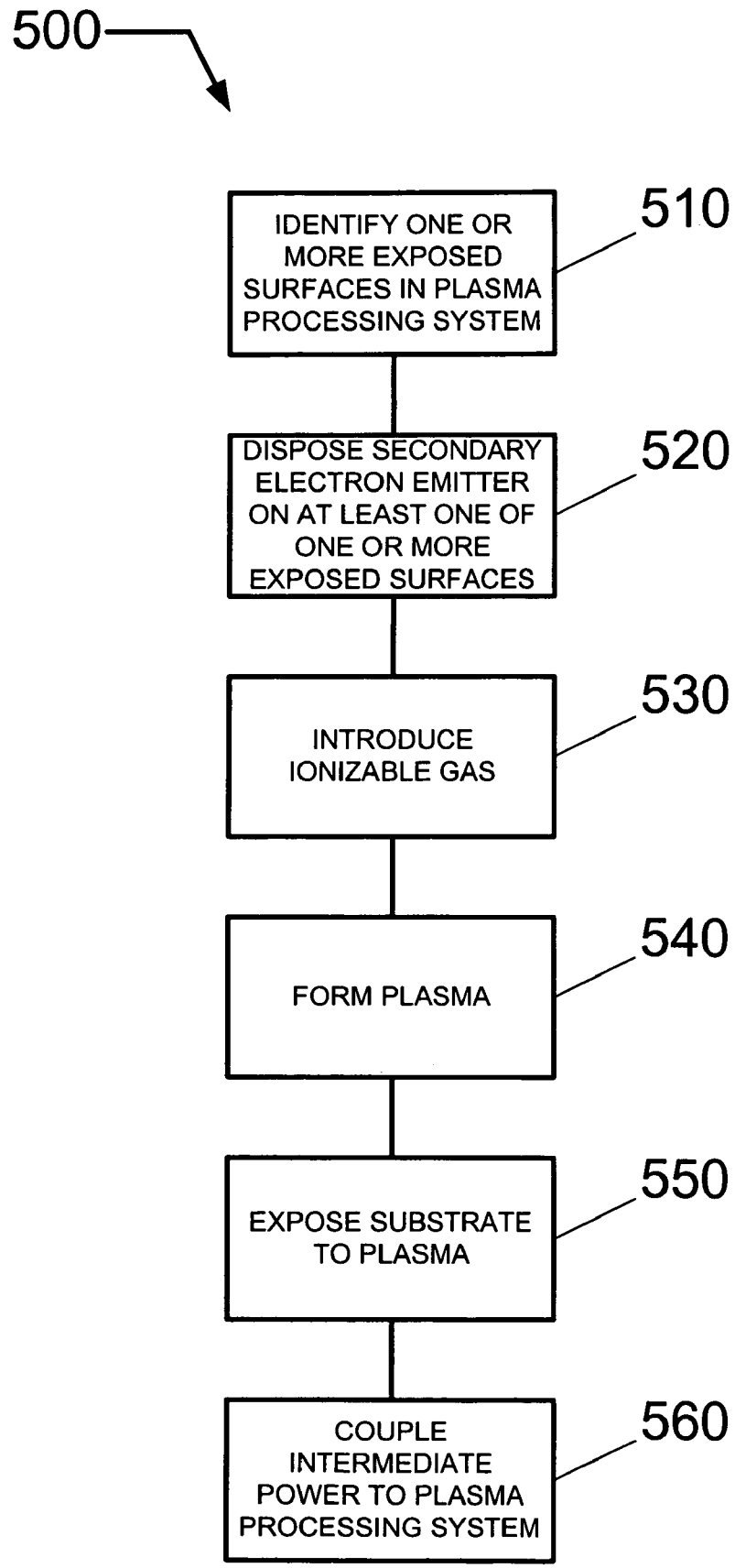
FIG. 11 presents a method of reducing charging damage to a substrate in a plasma processing system according to another embodiment of the present invention.

FIG. 11 presents a method for reducing charging damage to a substrate in a plasma processing system according to another embodiment of the present invention. The method is illustrated in a flowchart 500 beginning step 510 with identifying one or more exposed surfaces in the plasma processing system. The one or more exposed surfaces can comprise any surface in electrical contact with the plasma. For example, the exposed surfaces can comprise the upper surface of the substrate, the upper surface of the plasma processing system, the side-wall surface of the plasma processing system, and the lower surface of the plasma processing system.

In step 520, a secondary electron emitter can be disposed on at least one of the one or more exposed surfaces in the plasma processing system. The secondary electron emitter can comprise a material exhibiting a range of primary electron energies when incident thereon, provide a secondary electron yield greater than unity. For example, the secondary electron emitter can comprise silicon, alumina, etc.

In step 530, an ionizable gas is introduced to the plasma processins system, and, in step 540, a plasma is formed from the ionizable gas. In step 550, the substrate is exposed to the plasma.

In step 560, an intermediate power is coupled to the plasma processing system, wherein the intermediate power corresponds to the secondary electron yield greater than unity for the secondary electron emitter.

The intermediate power corresponds to a secondary electron yield from at least one of the exposed surfaces greater than unity. For example, when the exposed surface comprises silicon, the intermediate power level can range from 50 W to 1500 W, and can, for example, be substantially 600 W. Alternatively, the intermediate power level can be selected from a range of power corresponding to a range of primary electron energy from a minimum value to a maximum value, wherein the range extending from the minimum to maximum values is associated with a secondary electron yield greater than unity for the material of at least one of the exposed surfaces. For example, the minimum and maximum electron energy for a primary electron incident on a silicon surface, such that the secondary electron yield is greater than unity, is approximately 125 eV and 500 eV, respectively, which correspond to an intermediate power level of approximately 80 W and 1310 W (using equation (4)). Additionally, the intermediate power level can correspond to a primary electron energy substantially near the value associated with a peak secondary electron yield. For example, the peak secondary electron yield for silicon occurs at an energy of 250 eV, which corresponds to an intermediate power level of approximately 326 W (using equation (4)). In general, the intermediate power level can correspond to a power slightly greater than the power determined to be associated with the peak secondary electron yield of a material in order to maximize the probability of observing primary electrons with an energy associated with the peak secondary electron yield (i.e. selecting an appropriate electron energy distribution function.

The invention provides an effective method for surface charge reduction. Moreover, there are additional benefits of being able to control the surface charge. The uncontrollably accumulated surface charge might change the conditions for RF gas breakdown and for discharge sustainment. As an example, the low RF power discharge might not be able to ignite the gas if that power is used in the conditions of significant charge accumulation on the surfaces. Even if plasma ignites, similar effects might lead to plasma parameters being non-uniform or the energies of electrons and ions striking the surface being non-uniform. All of that might lead to non-uniformity of processing. The present invention, while directed on reducing the accumulated surface charge, will also make the plasma parameters being more uniform, stable, and do not change uncontrollably in time or from one wafer to another. Correspondingly, this will stabilize and improve the whole processing such as material etching or deposition.

While the exemplary embodiment described above has addressed the accumulation of negative charge, one of ordinary skill in the art will appreciate that the accumulation of positive charge can similarly be addressed using a voltage that reduces positive charge (i.e., a higher or lower voltage than was used during the positive charge accumulation).

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for reducing charging damage to a substrate in a plasma processing system comprising the steps:
   coupling a first power to said plasma processing system to perform a first process on said substrate using a first plasma;
   after said first process, coupling a second power to said plasma processing system, wherein said second power is lower than said first power and selected to reduce the accumulation of negative charge on at least one surface of said plasma processing system arising from applying said first power; and
   after coupling said second power, coupling a third power lower than said second power to perform a second process on said substrate.

2. The method as recited in claim 1, wherein said second power is non-cyclical.

3. The method as recited in claim 1, wherein said second power corresponds to a secondary electron yield greater than unity from at least one of said at least one exposed surface.

4. The method as recited in claim 1, wherein said coupling of said second power follows said coupling of said first power without extinguishing said plasma.

5. The method as recited in claim 1, wherein said coupling of said third power follows said coupling of said second power without extinguishing said first plasma.

6. The method as recited in claim 5, further comprising:
   extinguishing said second plasma corresponding to said coupling of said second power; and
   coupling said third power to said plasma processing system, wherein said coupling of said third power forms a third plasma.

7. The method as recited in claim 1, wherein said coupling of said first power to said plasma processing system alternates with said coupling of said second power to said plasma processing system during said processing of said substrate.

8. The method as recited in claim 1, wherein said first power is greater than approximately 1000 W.

9. The method as recited in claim 1, wherein said third power is less than approximately 500 W.

10. The method as recited in claim 1, wherein said second power is selected to reduce the accumulation of negative charge on said substrate.

11. The method as recited in claim 1, wherein said second power is selected to reduce the accumulation of negative charge on an electrode.

12. The method as recited in claim 1, wherein said second power is selected to reduce the accumulation of negative charge on a substrate holder.

13. The method as recited in claim 1, wherein the at least one surface comprises silicon.

14. The method as recited in claim 1, wherein at least one of the exposed surfaces comprises alumina.

15. The method as recited in claim 1, wherein said second power is greater than approximately 80 W and less than approximately 1310 W.

16. The method as recited in claim 1, wherein said second power is greater than approximately 115 W and less than approximately 1060 W.

17. The method as recited in claim 1, wherein said second power is greater than approximately 205 W and less than approximately 840 W.

18. The method as recited in claim 1, wherein said second power is greater than approximately 260 W and less than approximately 640 W.

19. The method as recited in claim 1, wherein said second power is greater than approximately 400 W and less than approximately 640 W.

20. The method as recited in claim 3, wherein said secondary electron yield greater than unity corresponds to a range of electron energy from $\epsilon_{min}$ to $\epsilon_{max}$, and said second power corresponds to $(\epsilon/C)^2$, wherein E comprises an electron energy in said range and C comprises a constant.

21. The method as recited in claim 20, wherein said constant ranges from approximately a value of 10 to 20.

22. The method as recited in claim 21, wherein said constant is approximately 14.

23. The method as recited in claim 20, wherein said minimum electron energy is approximately 125 eV, and said maximum electron energy is approximately 500 eV.

24. The method as recited in claim 20, wherein said range of electron energy further comprises a peak electron energy $\epsilon_{peak}$, said peak electron energy corresponds to a peak in the secondary electron yield.

25. The method as recited in claim 24, wherein said peak electron energy is approximately 250 eV.

26. The method as recited in claim 24, wherein said second power corresponds to an electron energy ranging from approximately the peak electron energy minus 10% to the peak electron energy plus 50%.

27. The method as recited in claim 24, wherein said second power corresponds to an electron energy ranging from approximately the peak electron energy minus 20% to the peak electron energy plus 60%.

28. A method for reducing charging damage to a substrate in a plasma processing system comprising the steps:
   coupling a first power to said plasma processing system to process said substrate using a first plasma;
   coupling a second power to said plasma processing system, wherein said second power is selected to reduce the accumulation of negative charge on at least one surface of said plasma processing system arising from applying said first power, wherein the process further comprising:
   extinguishing said first plasma corresponding to said coupling of said first power; and
   forming a second plasma, wherein said coupling of said second power forms said second plasma.

29. A method for reducing negative charge on exposed surfaces within a plasma processing chamber comprising the steps:
   introducing an ionizable gas into said plasma processing chamber;
   coupling a first power to the ionizable gas to perform a first process in said chamber;
   forming a plasma by coupling an intermediate power less than said first power to said ionizable gas, wherein said intermediate power causes a secondary electron yield to be greater than unity from at least one of said exposed surfaces; and
   coupling a post process power less than said intermediate power to said ionizable gas to perform a second process in said chamber.

30. The method as recited in claim 29, wherein said exposed surfaces comprise at least one substrate holder surface.

31. The method as recited in claim 29, wherein said exposed surfaces comprise at least one electrode surface.

32. The method as recited in claim 29, wherein said exposed surfaces comprise at least one silicon surface.

33. The method as recited in claim 29, wherein at least one of the exposed surfaces comprises silicon.

34. The method as recited in claim 29, wherein at least one of the exposed surfaces comprises alumina.

35. The method as recited in claim 29, wherein said intermediate power is greater than approximately 80 W and less than approximately 1310 W.

36. The method as recited in claim 29, wherein said intermediate power, is greater than approximately 260 W and less than approximately 640 W.

37. A method for reducing charging damage to a substrate in a plasma processing system comprising the steps:
   introducing an ionizable gas;
   forming a plasma from said ionizable gas;
   exposing said substrate to said plasma;
   extinguishing said plasma; and
   after said extinguishing, processing said substrate by coupling an intermediate power to said plasma processing system, wherein said intermediate power reduces the accumulation of negative charge on a substrate surface exposed to said plasma in said plasma processing system.

38. The method as recited in claim 37, wherein said intermediate power is greater than approximately 80 W and less than approximately 1310 W.

39. The method as recited in claim 37, wherein said intermediate power is greater than approximately 115 W and less than approximately 1060 W.

40. The method as recited in claim 37, wherein said intermediate power is greater than approximately 205 W and less than approximately 840 W.

41. The method as recited in claim 37, wherein said intermediate power is greater than approximately 260 W and less than approximately 640 W.

42. The method as recited in claim 37, wherein said intermediate power is greater than approximately 400 W and less than approximately 640 W.

43. The method as recited in claim 37, wherein said intermediate power corresponds to a secondary electron yield greater than unity from said substrate surface.

44. The method as recited in claim 43, wherein said secondary electron yield greater than unity corresponds to a range of electron energy from $\epsilon_{min}$ to $\epsilon_{max}$, and said second power corresponds to $(\epsilon/C)^2$, wherein comprises an electron energy in said range and C comprises a constant.

45. The method as recited in claim 44, wherein said constant ranges from approximately a value of 10 to 20.

46. The method as recited in claim 45, wherein said constant is approximately 14.

47. The method as recited in claim 44, wherein said minimum electron energy is approximately 125 eV, and said maximum electron energy is approximately 500 eV.

48. The method as recited in claim 44, wherein said range of electron energy further comprises a peak electron energy $\epsilon_{peak}$, said peak electron energy corresponds to a peak in the secondary electron yield.

49. The method as recited in claim 48, wherein said peak electron energy is approximately 250 eV.

50. The method as recited in claim 48, wherein said intermediate power corresponds to an electron energy ranging from approximately the peak electron energy minus 10% to the peak electron energy plus 50%.

51. The method as recited in claim 48, wherein said intermediate power corresponds to an electron energy ranging from approximately the peak electron energy minus 20% to the peak electron energy plus 60%.

52. A method for reducing charging damage to a substrate in a plasma processing system comprising the steps:
   identifying at least one exposed surface in said plasma processing system;
   providing a secondary electron emitter surface on at least one of the at least one exposed surface, wherein said secondary electron emitter surface comprises a material having a secondary electron yield greater than unity for a range of energy levels;
   introducing an ionizable gas to said plasma processing system;
   forming a plasma from said ionizable gas using a first power;
   exposing a substrate to said plasma in a first process; and
   coupling an intermediate power less than said first power to said plasma processing system to process said substrate, wherein said intermediate power corresponds to an energy level within said range of energy levels; and
   performing a second process at a power level less than said intermediate power.

53. A method for reducing charging damage to a substrate in a plasma processing system comprising the steps:
   exposing said substrate to a plasma;

coupling a first power to said plasma processing system to process said substrate; and coupling a second power to said plasma processing system, wherein said second power is less than the first power and selected to reduce the accumulation of electric charge on one or more surfaces exposed to said plasma in said plasma processing system; and coupling a third power to said plasma processing system to post process said substrate.

54. The method as recited in claim 53, wherein said second power is less than said first power.

55. The method as recited in claim 53, wherein said second power corresponds to a secondary electron yield from at least one of said exposed surfaces greater than unity.

56. The method as recited in claim 53, wherein said coupling of said second power follows said coupling of said first power without extinguishing said plasma.

57. The method as recited in claim 53, wherein said coupling of said first power is terminated and said plasma is extinguished, and said coupling of said second power forms a second plasma.

58. The method as recited in claim 53, wherein said method further comprises coupling a third power to said plasma processing system to post-process said substrate.

59. The method as recited in claim 58, wherein said third power is less than said second power.

60. The method as recited in claim 58, wherein said coupling of said third power follows said coupling of said second power without extinguishing said plasma.

61. The method as recited in claim 57, wherein said coupling of said third power follows said coupling of said second power without extinguishing said second plasma.

62. The method as recited in claim 57, wherein said coupling of said second power is terminated and said second plasma is extinguished, and said coupling of said third power forms a third plasma.

63. The method as recited in claim 53, wherein said coupling of said first power to said plasma processing system alternates with said coupling of said second power to said plasma processing system during said processing of said substrate.

64. The method as recited in claim 53, wherein said first power is greater than 1000 W.

65. The method as recited in claim 59, wherein said third power is less than 500 W.

66. The method as recited in claim 53, wherein said second power is greater than 50 W and less than 1500 W.

67. The method as recited in claim 53, wherein said second power is substantially 600 W.

68. The method as recited in claim 53, wherein said second power is selected to reduce the accumulation of negative charge on one or more surfaces exposed to said plasma, in said plasma processing system.

69. The method as recited in claim 53, wherein said second power is selected to reduce the accumulation of positive charge on one or more surfaces exposed to said plasma in said plasma processing system.

70. A method for reducing charging damage to a substrate in a plasma processing system comprising the steps:

exposing said substrate to a plasma;

coupling a first power to said plasma processing system to process said substrate; and coupling a second power to said plasma processing system, wherein said second power is selected to reduce the accumulation of electric charge on one or more surfaces exposed to said plasma in said plasma processing system, wherein said second power is higher than said first power.

* * * * *